United States Patent [19]

Sandhu et al.

[11] Patent Number: 5,318,927
[45] Date of Patent: Jun. 7, 1994

[54] METHODS OF CHEMICAL-MECHANICAL POLISHING INSULATING INORGANIC METAL OXIDE MATERIALS

[75] Inventors: Gurtej S. Sandhu; Donald L. Westmoreland; Trung T. Doan, all of Boise, Id.

[73] Assignee: Micron Semiconductor, Inc., Boise, Id.

[21] Appl. No.: 55,085

[22] Filed: Apr. 29, 1993

[51] Int. Cl.$^5$ ................................ H01L 21/60
[52] U.S. Cl. .................. 437/225; 51/293; 51/295; 51/309; 106/3; 437/228
[58] Field of Search .............. 51/293, 295, 309; 106/3; 437/225, 228

[56] References Cited

U.S. PATENT DOCUMENTS

| | | | |
|---|---|---|---|
| 3,979,239 | 9/1976 | Walsh | 437/225 |
| 4,022,625 | 5/1977 | Shelton | 106/3 |
| 4,057,939 | 11/1977 | Basi | 106/3 |
| 4,169,337 | 10/1979 | Payne | 106/3 |
| 5,084,419 | 1/1992 | Sakao | 437/228 |
| 5,096,854 | 3/1992 | Saito et al. | 437/225 |
| 5,128,281 | 7/1992 | Dyer et al. | 437/225 |
| 5,162,248 | 11/1992 | Dennison et al. | 437/228 |
| 5,188,987 | 2/1993 | Ogino | 437/228 |
| 5,209,816 | 5/1993 | Yu et al. | 437/228 |
| 5,225,034 | 7/1993 | Yu et al. | 437/228 |

Primary Examiner—Mark L. Bell
Assistant Examiner—Willie J. Thompson
Attorney, Agent, or Firm—Wells, St. John, Roberts, Gregory & Matkin

[57] ABSTRACT

Chemical-mechanical polishing methods are disclosed for removing insulating inorganic metal oxide materials from semiconductor wafers. Such utilize aqueous acids or base slurries having a pK ionization constant of less than or equal to 5.0. Alternately, aqueous slurries having an oxidizing agent with an E° reduction potential of greater than or equal to 1.0 volt are utilized. Further alternatively, non-aqueous slurries having a liquid halogenated or pseudohalogenated reactant are utilized. Further, slurries having an organic ligand precursor are utilized.

41 Claims, 1 Drawing Sheet

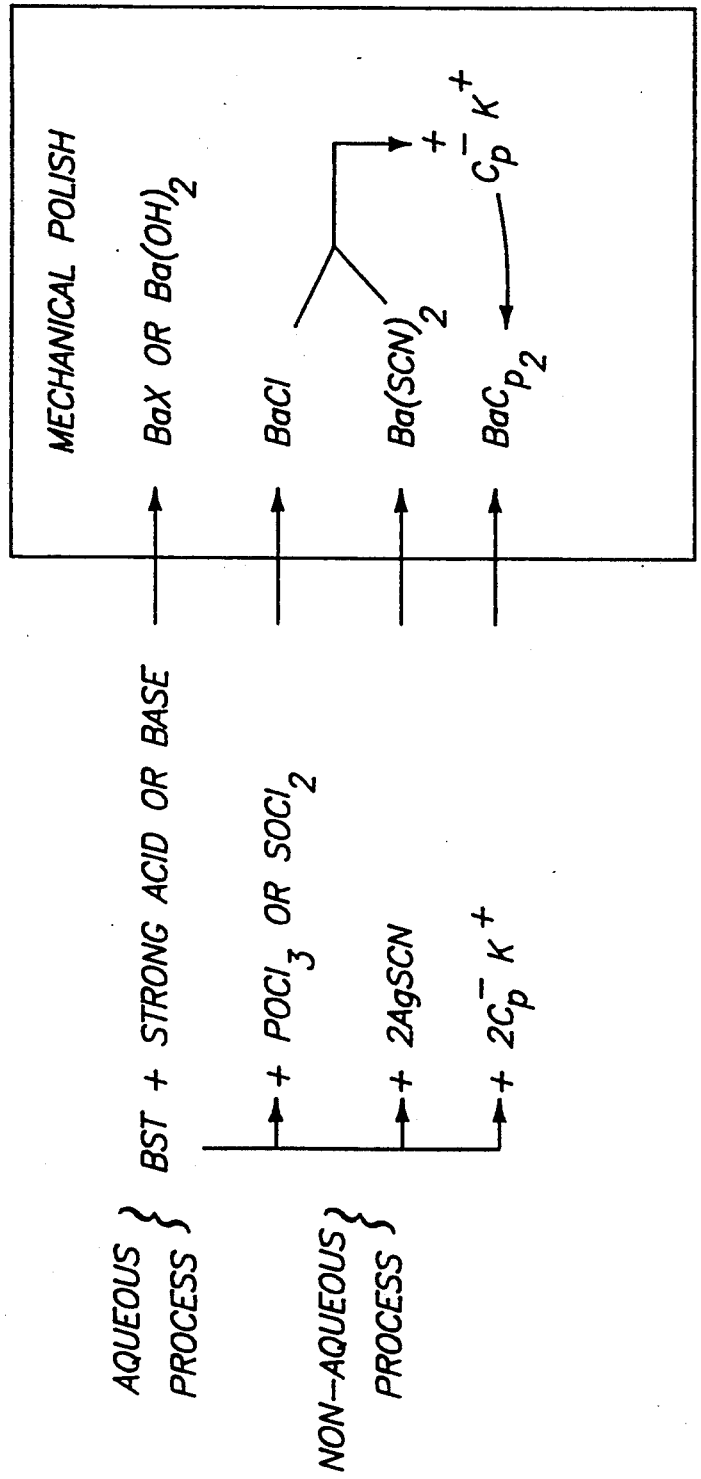

METHODS OF CHEMICAL-MECHANICAL POLISHING INSULATING INORGANIC METAL OXIDE MATERIALS

TECHNICAL FIELD

This invention relates principally to removal of insulating inorganic metal oxide materials, including ferroelectric materials, in semiconductor wafer processing.

BACKGROUND OF THE INVENTION

Insulating inorganic metal oxide materials, such as ferroelectric materials or perovskite materials, have high dielectric constants and low current leakage which make them attractive as cell dielectric materials for high density DRAMs. Perovskite material and other ferroelectric materials exhibit a number of unique and interesting properties—both physical and electrical. The defining property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Despite the advantages of the high dielectric constants and low leakage, insulating inorganic metal oxide materials suffer from many drawbacks. One major hurdle to incorporating perovskites into semiconductor processing methods is the fact that no reliable method for removing such materials exists. A major problem is that most of the inorganic compounds formed, such as by way of example by dry chemical etching, are solids having high boiling temperatures. In otherwords, conventional dry etching of perovskite materials results in formation of solid compounds, as opposed to gaseous compounds, as in dry etching techniques for other materials which are then easily expelled from the wafer. For example, dry etching of perovskite materials containing barium or strontium typically produces chlorides, such as $BaCl_x$, $SrCl_x$, and $TiCl_4$. Only the latter of these is volatile under typical semiconductor dry etching wafer processing conditions.

Accordingly, there remain needs for development of semiconductor wafer processing methods for removing insulating inorganic metal oxide materials from semiconductor wafer substrates.

BRIEF DESCRIPTION OF THE DRAWINGS

Preferred embodiments of the invention are described below with reference to the following accompanying drawings.

FIG. 1 is a composite diagram of various aspects of examples of the invention useful in chemical mechanical polishing of insulating inorganic metal oxide materials.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of chemical-mechanical polishing (CMP) comprises the following steps:

providing a substrate having an exposed layer of an insulating inorganic metal oxide material, the exposed layer being adhered to the substrate by an adhesive force;

subjecting the substrate having the exposed layer of insulating inorganic metal oxide material to an aqueous chemical-mechanical polishing slurry comprising an acid or base and a solid polishing particulate, the acid or base solution having a pK ionization constant of less than or equal to 5.0;

reacting the exposed layer with the acid or base of the aqueous solution to produce a solid material adhered to the substrate by an adhesive force which is less than the previous adhesive force by which the insulating inorganic metal oxide material layer was held to the substrate; and removing the substrate adhered solid material from the substrate by chemical-mechanical polishing action using the aqueous chemical-mechanical polishing slurry.

In accordance with another aspect of the invention, a semiconductor processing method of chemical-mechanical polishing comprises the following steps:

subjecting a wafer having an exposed layer of an insulating inorganic metal oxide material to an aqueous chemical-mechanical polishing slurry comprising an acid or base and a solid polishing particulate, the acid or base solution having a pK ionization constant of less than or equal to 5.0, the solid polishing particulate having a hardness;

reacting the exposed layer with the acid or base of the aqueous solution to produce a wafer adhered solid material having a hardness which is less than the hardness of the solid polishing particulate; and removing the wafer adhered solid material from the wafer by chemical-mechanical polishing action using the aqueous chemical-mechanical polishing slurry.

Example insulating inorganic metal oxide materials usable in accordance with the invention include ferroelectrics or other perovskite materials, such as titanates, zirconates, niobates, tantalates, and nitrates, such as those shown below.

| | |
|---|---|
| Barium Titanate | $BaTiO_3$ |
| Barium Strontium Titanate | $Ba(Sr)TiO_3$ |
| Barium Lead Titanate | $Ba(Pb)TiO_3$ |
| Lead Titanate | $PbTiO_3$ |
| Lead Zirconate | $PbZnO_3$ |
| Lead Zirconate Titanate | $Pb(Zn,Ti)O_3$ |
| Lead Lanthinum Titanate | $Pb(La)TiO_3$ |
| Lead Lanthinum Zirconate Titanate | $Pb(La)Zn(Ti)O_3$ |
| Strontium Titanate | $SrTiO_3$ |
| Potassium Nitrate | $KNO_3$ |
| Lithium Niobate | $LiNbO_3$ |
| Lithium Tantalate | $LiTaO_3$ |
| Lead Magnesium Niobate | $Pb(Mg,Nb)O_3$ |
| (Mixed phases) | $Pb(Mg,Nb)O_3:PbTiO_3$ |
| Bismuth Titanate | $Bi_4Ti_3O_{12}$ |

Example acidic aqueous solutions include HCl or $H_2SO_4$ based solutions. Where, for example, the insulating inorganic metal oxide material comprises barium strontium titanate, the following Equations 1 and 2 are exemplary of the anticipated reactions.

$$Ba(Sr)TiO_3 \xrightarrow{HCl}$$ (1)

-continued $$BaCl_2 + SrCl_2 + H_2O + TiO_2 + \text{SOLUBLE TITANATES}$$

$$Ba(Sr)TiO_3 \xrightarrow{H_2SO_4} \quad (2)$$

$$BaSO_4 + SrSO_4 + H_2O + TiO_2 + \text{SOLUBLE TITANATES}$$

Typical and example slurry particulate material comprises $Al_2O_3$ or $SiO_2$ particles. By the above example chemical reactions, the chlorides and sulfates which are produced have respective hardnesses which are less than the slurry particulate material. Further, the produced chlorides and sulfates are not as strongly adhered to the underlying substrate as was the predecessor insulating inorganic metal oxide material. The chlorides and sulfates are removed by chemical-mechanical polishing action in the same polishing treatment. Such removal action might result in the chemical aspect of the chemical-mechanical polishing predominating, or in the mechanical aspect from interaction with the slurry particles predominating.

The $TiO_2$ formed by the above example reactions would typically be polished off by the CMP action. $TiO_2$ has a hardness which is less than that of the typical $SiO_2$ or $Al_2O_3$ particulate. Small amounts of $TiCl_4$ might be produced from HCl, but such would be chemically converted to $TiO_2$ in the presence of the aqueous solution.

Example aqueous basic solutions include KOH, NaOH and $NH_4OH$ solutions. Exemplary reactions with barium strontium titanate are shown by Equations 3 and 4 below.

$$Ba(Sr)TiO_3 \xrightarrow{KOH} Ba(OH)_2 + Sr(OH)_2 + \quad (3)$$

$$H_2TiO_4 \xrightarrow{KOH} K_2Ti_2O_7 + \text{OTHERS}$$

$$Ba(Sr)TiO_3 \xrightarrow{NaOH} Ba(OH)_2 + Sr(OH)_2 + \quad (4)$$

$$H_2TiO_4 \xrightarrow{NaOH} Na_2Ti_2O_7 + \text{OTHERS}$$

The "others" material produced may or may not have hardness values that are less than the $SiO_2$ or $Al_2O_3$ particulate. Example suitable concentration for the above equations 1-4 would be a 0.01M or stronger solution.

In accordance with still another aspect of the invention, a semiconductor processing method of chemical-mechanical polishing comprises the following steps:

providing a substrate having an exposed layer of an insulating inorganic metal oxide material, the exposed layer being adhered to the substrate by an adhesive force subjecting the substrate having the exposed layer of insulating inorganic metal oxide material to an aqueous chemical-mechanical polishing slurry comprising an oxidizing agent and a solid polishing particulate, the oxidizing agent having an E° reduction potential of greater than or equal to 1.0 volt;

reacting the exposed layer with the oxidizing agent of the aqueous solution to produce a solid material adhered to the substrate by an adhesive force which is less than the previous adhesive force by which the insulating inorganic metal oxide material layer was held to the substrate; and removing the substrate adhered solid material from the substrate by chemical-mechanical polishing action using the aqueous chemical-mechanical polishing slurry.

In accordance with still a further aspect of the invention, a semiconductor processing method of chemical-mechanical polishing comprises the following steps;

subjecting a wafer having an exposed layer of an insulating inorganic metal oxide material to an aqueous chemical-mechanical polishing slurry comprising an oxidizing agent and a solid polishing particulate, the oxidizing agent having an E° reduction potential of greater than or equal to 1.0 volt, the solid polishing particulate having a hardness;

reacting the exposed layer with the oxidizing agent of the aqueous solution to produce a wafer adhered solid material having a hardness which is less than the hardness of the solid polishing particulate; and removing the wafer adhered solid material from the wafer by chemical-mechanical polishing action using the aqueous chemical-mechanical polishing slurry.

Example and preferred insulating inorganic metal oxide materials are as described above. Example and preferred oxidizing agents include $H_2O_2$, nitrates, chromates, permanganates, $O_3$ and $F_2$, or mixtures thereof. An example reaction where the oxidizing agent is $H_2O_2$ is shown in Equation 5 below.

$$Ba(Sr)TiO_3 \xrightarrow{H_2O_2} BaO + SrO + TiO_2 + \text{OTHERS} \quad (5)$$

Typical concentration of $H_2O_2$ would be 35% by volume. The BaO and SrO which are produced have respective hardnesses which are less than the slurry particulate material. Further, the BaO and SrO are not as strongly adhered to the underlying substrate as was the predecessor insulating inorganic metal oxide material. The formed BaO and SrO material would then be removed by the mechanical polishing and/or chemical action of the chemical-mechanical polishing step. BaO and SrO would further react with water to form bases $Ba(OH)_2$, the removal of which can be enhanced by the addition of acid.

In accordance with yet another aspect of the invention, a semiconductor processing method of chemical-mechanical polishing comprises the following steps:

subjecting a wafer having an exposed layer of an insulating inorganic metal oxide material to a non-aqueous halogenated or pseudohalogenated reactant in an inert atmosphere to form a wafer adhered halogenated or pseudohalogenated material; and removing the wafer adhered halogenated or pseudohalogenated material from the wafer by chemical-mechanical polishing action using a non-aqueous chemical-mechanical polishing slurry comprising the non-aqueous halogenated or pseudohalogenated reactant.

An example inert atmosphere would be nitrogen or a noble gas. Example halogenated reactants include $POCl_3$ and $SOCl_2$. Such could be utilized undiluted at 100%, or combined with dry solvents such as any substantially inert aprotic solvent. Such include for example toluene, various ethers, ketones, DMSO and others.

An example reaction involving $SOCl_2$ as the reactant and barium strontium titanate as the insulating inorganic metal oxide material is shown below in Equation 6.

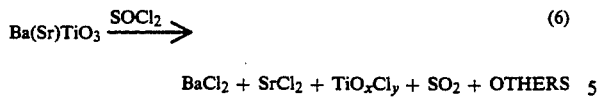

(6)

BaCl$_2$ + SrCl$_2$ + TiO$_x$Cl$_y$ + SO$_2$ + OTHERS

The BaCl$_2$ and TiO$_x$Cl$_y$ materials would then be removed by further chemical-mechanical polishing action, preferably in the same chemical-mechanical polishing step.

An example pseudohalogenated reactant and reaction are illustrated by the following Equation 7.

(7)

Other possible examples of pseudohalogenating compounds are:

| | |
|---|---|
| P(SCN)$_3$ | Phosphorous thiocyanate |
| (SCN)$_2$ | Thiocyanogen |
| S(SCN)$_2$ | Cyanogen sulfide |
| Hg(NCS)$_2$ | Mercury (II) thiocyanate |
| Hg(NCO)$_2$ | Mercury (II) cyanate |
| AgNCO | Silver cyanate |
| CH$_3$NCO | Methylisocyanate |
| C$_6$H$_5$NCO | Phenylisocyanate |
| BrCN | Cyanogen bromide |

The concentrations of the pseudohalogens should be 20% up to 100% when they are liquids. Solvents used can be any nonreactive suitably dried and oxygen-free material such as ether, acetonitrile, carbon disulfide and toluene.

One chemical-mechanical polishing reaction sequence for removing the formed halogenated or pseudohalogenated material, such as BaCl$_2$, includes at least initially a predominately chemical path. Here, the chemical-mechanical polishing slurry preferably further includes a liquid organic ligand precursor. Alternately, the organic ligand precursor might comprise a solid within the slurry. In accordance with this aspect of the invention, the method further comprises reacting the formed halogenated or pseudohalogenated material with the organic ligand precursor to form a wafer adhered metal organic coordination complex incorporating the organic ligand precursor. Such is then removed from the wafer by chemical-mechanical polishing action with the same slurry where an unknown one of the chemical or mechanical actions of the process may predominate in such removal.

Example organic ligand precursors comprise cyclic, acyclic, polycyclic and aromatic compounds, and materials which upon reaction with the halogenated or pseudohalogenated material form a metal-organic coordination complex which is heterocyclic. Beta diketones are examples of the latter of such materials. Example materials include cyclopentadienyl, indenyl, and fluorenyl compounds as shown below. K$^+$ is an example of a cation of such compounds.

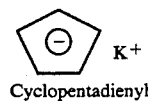

Cyclopentadienyl

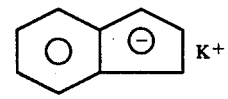

Indenyl

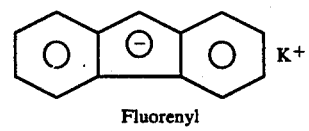

Fluorenyl

By further way of example only, other products might be utilized such as alkyl or other substituted cyclopentadiene derivatives, such as methylcyclopentadienyl, pentamethylcyclopentadienyl and trimethylsilycyclopentadienyl compounds, as shown below:

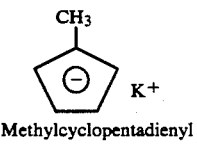

Methylcyclopentadienyl

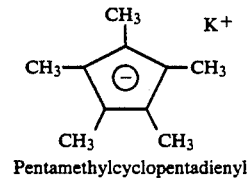

Pentamethylcyclopentadienyl

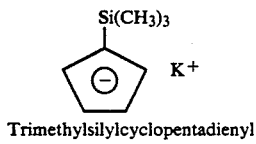

Trimethylsilylcyclopentadienyl

Examples of diketones include acetyl acetone, hexafluoroacetyl acetone 1,1,1,2,2,3,3 heptafluoro-7,7,-dimethyl-4,6-octanedione, and dipivaloylmethanate as shown below:

Acetyl Acetonato

Hexafluoroacetyl Acetonato 1,1,1,2,2,3,3 heptafluoro-
7,7-dimethyl-4,6-octanatodionato -continued

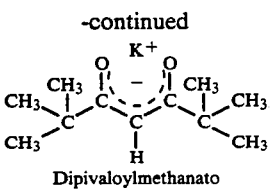

Dipivaloylmethanato

Example reactions involving cyclopentadienyl, potassium and 1,1,1,2,2,3,3 heptafluoro-7,7,-dimethyl-4,6-octanedionato potassium are shown in Equations 8 and 9 below. $C_p$ and FOD refer cyclopentadienyl and the potassium 1,1,1,2,2,3,3 heptafluoro-7,7,-dimethyl-4,6-octanedionato, respectively.

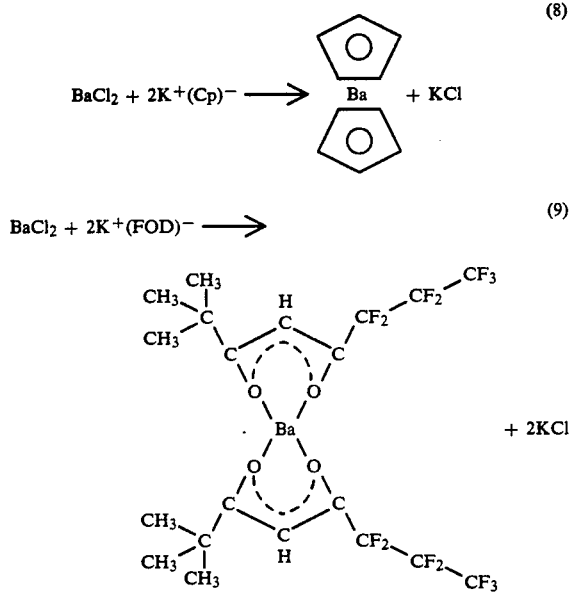

(8)

(9)

The metal organic coordination complex which is formed (i.e., the $Ba(C_p)_2$ and $Ba(FOD)_2$) would be removed by further chemical-mechanical polishing in the same chemical-mechanical polishing step utilizing the slurry.

In accordance with still a further aspect of the invention, a semiconductor processing method of chemical-mechanical polishing comprises the following steps:

a) subjecting a wafer having an exposed layer of an insulating inorganic metal oxide material to chemical-mechanical polishing action in a chemical-mechanical polishing slurry comprising an organic ligand precursor, the insulating inorganic metal oxide material reacting with the organic ligand precursor to chemically form an upper surface of a metal organic coordination complex incorporating the organic ligand precursor;

b) polishing the upper surface with the chemical-mechanical polishing slurry to re-expose insulating inorganic metal oxide material; and c) repeating steps "a" and "b". Alternately considered, halogenation is avoided altogether by use of a suitable organic ligand precursor in a dried solvent, such as the solvents referred to above. If, for example, a potassium or magnesium salt of a cyclopentadienyl or an acetylacetonato compound is used, this would form an organo-barium/strontium complex along with a titanate directly from, for example, barium strontium titanate. An example is shown below in Equation 10.

The materials which are formed would be easily removed by the chemical-mechanical polishing action with the slurry.

The reaction illustrated by Equation 10 is not expected to be highly driven to the right side of the equation. This is anticipated to result in formation of only very thin layers of the reactant product which would be removed by the mechanical action of the slurry. Such further exposes the insulating inorganic metallic oxide, such as barium strontium titanate, for further direct reaction with the organic ligand precursor. Such would repeatedly occur during the process to some desired end point.

For certain organic precursors, for instance a few cyclopentadienyl of phenyl heterocyclic compounds, the reaction can be enhanced or driven by UV light, or by reduced alkali metal in the presence of the precursor material. Specifically, reactions involving the formation of organobarium or organostrontium compounds can often be driven more towards completion by the addition of UV light. This is particularly true for ligands that are strong UV absorbers, such as aromatics and alkenes.

In accordance with the above, a CMP slurry containing a combination of halogenated or pseudohalogenated reactant and an organic ligand precursor might in combination produce both wafer adhered halogenated or pseudohalogenated material and direct reaction of the insulating inorganic metal oxide with the organic ligand precursor to form a wafer adhered metal organic coordination complex.

All of the reactions referred to above are anticipated to be used at atmospheric pressure and at room or elevated temperatures, as is common in chemical-mechanical processes.

FIG. 1 provides a diagram of chemical equations of various aspects of the invention using for example barium strontium titanate (BST) as the inorganic insulating metal oxide.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of chemical-mechanical polishing comprising the following steps:

providing a substrate having an exposed layer of a ferroelectric material, the exposed layer being adhered to the substrate by an adhesive force;

subjecting the substrate having the exposed layer of ferroelectric material to an aqueous chemical-mechanical polishing slurry comprising an acid or base and a solid polishing particulate, the acid or base solution having a pK ionization constant of less than or equal to 5.0;

reacting the exposed ferroelectric layer with the acid or base of the aqueous solution to produce a solid material adhered to the substrate by an adhesive force which is less than the previous adhesive force by which the ferroelectric material layer was held to the substrate; and removing the substrate adhered solid material from the substrate by chemical-mechanical polishing action using the aqueous chemical-mechanical polishing slurry.

2. The semiconductor processing method of claim 1 wherein the aqueous slurry is acidic, and comprises HCl or $H_2SO_4$.

3. The semiconductor processing method of claim 1 wherein the aqueous slurry is basic, and comprises at least one of KOH, NaOH or $NH_4OH$.

4. The semiconductor processing method of claim 1 wherein the ferroelectric material is selected from the group consisting of zirconates, niobates, nitrates, titanates and tantalates, or mixtures thereof.

5. A semiconductor processing method of chemical-mechanical polishing comprising the following steps:

subjecting a wafer having an exposed layer of a ferroelectric material to an aqueous chemical-mechanical polishing slurry comprising an acid or base and a solid polishing particulate, the acid or base solution having a Pk ionization constant of less than or equal to 5.0, the solid polishing particulate having a hardness;

reacting the exposed ferroelectric layer with the acid or base of the aqueous solution to produce a wafer adhered solid material having a hardness which is less than the hardness of the solid polishing particulate; and removing the wafer adhered solid material from the wafer by chemical-mechanical polishing action using the aqueous chemical-mechanical polishing slurry.

6. The semiconductor processing method of claim 5 wherein the aqueous slurry is acidic, and comprises HCl or $H_2SO_4$.

7. The semiconductor processing method of claim 5 wherein the aqueous slurry is basic, and comprises at least one of KOH, NaOH or $NH_4OH$.

8. The semiconductor processing method of claim 1 wherein the ferroelectric material is selected from the group consisting of zirconates, niobates, nitrates, titanates and tantalates, or mixtures thereof.

9. A semiconductor processing method of chemical-mechanical polishing comprising the following steps:

providing a substrate having an exposed layer of a ferroelectric material, the exposed layer being adhered to the substrate by an adhesive force subjecting the substrate having the exposed layer of ferroelectric material to an aqueous chemical-mechanical polishing slurry comprising an oxidizing agent and a solid polishing particulate, the oxidizing agent having an E° reduction potential of greater than or equal to 1.0 volt;

reacting the exposed ferroelectric layer with the oxidizing agent of the aqueous solution to produce a solid material adhered to the substrate by an adhesive force which is less than the previous adhesive force by which the ferroelectric material layer was held to the substrate; and removing the substrate adhered solid material from the substrate by chemical-mechanical polishing action using the aqueous chemical-mechanical polishing slurry.

10. The semiconductor processing method of claim 9 wherein the oxidizing agent is selected from the group consisting of $H_2O_2$, nitrates, chromates, permanganates, $O_3$ and $F_2$, or mixtures thereof.

11. The semiconductor processing method of claim 9 wherein the ferroelectric material is selected from the group consisting of zirconates, niobates, nitrates, titanates and tantalates, or mixtures thereof.

12. A semiconductor processing method of chemical-mechanical polishing comprising the following steps:

subjecting a wafer having an exposed layer of a ferroelectric material to an aqueous chemical-mechanical polishing slurry comprising an oxidizing agent and a solid polishing particulate, the oxidizing agent having an E° reduction potential of greater than or equal to 1.0 volt, the solid polishing particulate having a hardness;

reacting the exposed ferroelectric layer with the oxidizing agent of the aqueous solution to produce a wafer adhered solid material having a hardness which is less than the hardness of the solid polishing particulate; and removing the wafer adhered solid material from the wafer by chemical-mechanical polishing action using the aqueous chemical-mechanical polishing slurry.

13. The semiconductor processing method of claim 12 wherein the oxidizing agent is selected from the group consisting of $H_2O_2$, nitrates, chromates, permanganates, $O_3$ and $F_2$, or mixtures thereof.

14. The semiconductor processing method of claim 12 wherein the ferroelectric material is selected from the group consisting of zirconates, niobates, nitrates, titanates and tantalates, or mixtures thereof.

15. A semiconductor processing method of chemical-mechanical polishing comprising the following steps:

subjecting a wafer having an exposed layer of an insulating inorganic metal oxide material to a non-aqueous liquid halogenated or pseudohalogenated reactant in an inert atmosphere to form a wafer adhered halogenated or pseudohalogenated material; and removing the wafer adhered halogenated or pseudohalogenated material from the wafer by chemical-mechanical polishing action using a non-aqueous chemical-mechanical polishing slurry comprising the non-aqueous liquid halogenated or pseudohalogenated reactant.

16. The semiconductor processing method of claim 15 wherein the reactant is selected from the group consisting of $POCl_3$ and $SOCl_2$, or mixtures thereof.

17. The semiconductor processing method of claim 15 wherein the reactant is selected from the group consisting of $P(SCN)_3$, $(SCN)_2$, $S(SCN)_2$, $Hg(NCS)_2$, $Hg(NCO)_2$, $AgNCO$, $CH_3NCO$, $C_6H_5NCO$, $BrCN$, or mixtures thereof.

18. The semiconductor processing method of claim 15 wherein the insulating inorganic metal oxide material comprises a ferroelectric material.

19. The semiconductor processing method of claim 18 wherein the ferroelectric material is selected from the group consisting of zirconates, niobates, nitrates, titanates and tantalates, or mixtures thereof.

20. The semiconductor processing method of claim 15 wherein the chemical-mechanical polishing slurry further comprises an organic ligand precursor, the method further comprising:

reacting the insulating inorganic metal oxide with the organic ligand precursor of the slurry to form a wafer adhered metal organic coordination complex incorporating the organic ligand precursor; and removing the metal organic coordination complex from the wafer by chemical-mechanical polishing action using the slurry.

21. The semiconductor processing method of claim 15 wherein the chemical-mechanical polishing slurry further comprises an organic ligand precursor, the method further comprising:

reacting the insulating inorganic metal oxide with the organic ligand precursor of the slurry to form a wafer adhered metal organic coordination complex incorporating the organic ligand precursor; and polishing the metal organic coordination complex with the chemical-mechanical polishing slurry.

22. The semiconductor processing method of claim 16 wherein the chemical-mechanical polishing slurry further comprises an organic ligand precursor, the method further comprising:

reacting the halogenated or pseudohalogenated material with the organic ligand precursor to form a wafer adhered metal organic coordination complex incorporating the organic ligand precursor; and removing the wafer adhered metal organic coordination complex by chemical-mechanical polishing action using the slurry.

23. The semiconductor processing method of claim 22 wherein the reacting step comprises exposing the wafer to ultraviolet light.

24. The semiconductor processing method of claim 22 wherein the reactant is selected from the group consisting of $POCl_3$ and $SOCl_2$, or mixtures thereof.

25. The semiconductor processing method of claim 22 wherein the insulating inorganic metal oxide material comprises a ferroelectric material.

26. The semiconductor processing method of claim 22 wherein the insulating inorganic metal oxide material comprises a ferroelectric material selected from the group consisting of zirconates, niobates, nitrates, titanates and tantalates, or mixtures thereof.

27. The semiconductor processing method of claim 22 wherein the organic ligand precursor comprises an aromatic compound.

28. The semiconductor processing method of claim 22 wherein the organic ligand precursor comprises a material which upon reaction with the halogenated or pseudohalogenated material forms a metal organic coordination complex which is heterocyclic.

29. The semiconductor processing method of claim 22 wherein the organic ligand precursor comprises cyclopentadiene or a cyclopentadiene derivative.

30. The semiconductor processing method of claim 22 wherein the organic ligand precursor comprises a fused polycyclic.

31. The semiconductor processing method of claim 22 wherein the organic ligand precursor is acyclic.

32. The semiconductor processing method of claim 22 wherein the organic ligand precursor comprises a beta diketone which upon reaction with the halogenated or pseudohalogenated material forms a metal organic coordination complex which is heterocyclic.

33. A semiconductor processing method of chemical-mechanical polishing comprising the following steps:

a) subjecting a wafer having an exposed layer of an insulating inorganic metal oxide material to chemical-mechanical polishing action in a chemical-mechanical polishing slurry comprising an organic ligand precursor, the insulating inorganic metal oxide material reacting with the organic ligand precursor to chemically form an upper surface of a metal organic coordination complex incorporating the organic ligand precursor;

b) polishing the upper surface with the chemical-mechanical polishing slurry to re-expose insulating inorganic metal oxide material; and c) repeating steps "a" and "b".

34. The semiconductor processing method of claim 33 wherein the insulating inorganic metal oxide material comprises a ferroelectric material.

35. The semiconductor processing method of claim 33 wherein the insulating inorganic metal oxide material comprises a ferroelectric material selected from the group consisting of zirconates, niobates, nitrates, titanates and tantalates, or mixtures thereof.

36. The semiconductor processing method of claim 33 wherein the organic ligand precursor comprises an aromatic compound.

37. The semiconductor processing method of claim 33 wherein the organic ligand precursor comprises a material which upon reaction with the halogenated or pseudohalogenated material forms a metal organic coordination complex which is heterocyclic.

38. The semiconductor processing method of claim 33 wherein the organic ligand precursor comprises cyclopentadiene or a cyclopentadiene derivative.

39. The semiconductor processing method of claim 33 wherein the organic ligand precursor comprises a fused polycyclic.

40. The semiconductor processing method of claim 33 wherein the organic ligand precursor comprises a beta-diketone which upon reaction with the halogenated or pseudohalogenated material forms a metal organic coordination complex which is heterocyclic.

41. The semiconductor processing method of claim 33 further comprising exposing the wafer to ultraviolet light during step "a".

* * * * *